(12) United States Patent
Yoshida

(10) Patent No.: US 8,709,590 B2
(45) Date of Patent: Apr. 29, 2014

(54) HOT-PRESS CUSHION MATERIAL AND MANUFACTURING METHOD OF THE SAME

(75) Inventor: Akira Yoshida, Kanuma (JP)

(73) Assignee: Yamauchi Corporation, Osaka (JP)

( * ) Notice: Subject to any disclaimer, the term of this patent is extended or adjusted under 35 U.S.C. 154(b) by 0 days.

(21) Appl. No.: 11/779,480

(22) Filed: Jul. 18, 2007

(65) Prior Publication Data

US 2008/0021134 A1 Jan. 24, 2008

(30) Foreign Application Priority Data

Jul. 18, 2006 (JP) ................................. 2006-195985

(51) Int. Cl.
*B32B 27/00* (2006.01)
*B32B 3/26* (2006.01)
*B32B 5/24* (2006.01)
*D21H 13/00* (2006.01)

(52) U.S. Cl.
USPC ............... 428/319.3; 428/304.4; 428/311.11; 428/311.51; 427/487; 427/513; 442/59

(58) Field of Classification Search
USPC ............ 523/219, 200, 217; 428/306.6, 305.5, 428/307.3, 308.4, 308.8, 311.11, 313.5
See application file for complete search history.

(56) References Cited

U.S. PATENT DOCUMENTS

| | | | | |
|---|---|---|---|---|
| 3,616,178 A | * | 10/1971 | Gurin et al. | 428/343 |
| 3,887,750 A | | 6/1975 | Duckett et al. | |
| 4,093,764 A | * | 6/1978 | Duckett et al. | 428/113 |
| 4,133,927 A | * | 1/1979 | Tomoda et al. | 428/215 |
| 4,143,198 A | * | 3/1979 | Sinn et al. | 442/63 |
| 4,284,683 A | * | 8/1981 | Hipchen et al. | 428/113 |
| 4,585,811 A | * | 4/1986 | Preis et al. | 523/206 |
| 5,419,957 A | * | 5/1995 | Martin et al. | 428/311.11 |
| 5,549,968 A | * | 8/1996 | Byers et al. | 442/70 |
| 5,750,244 A | * | 5/1998 | Christensen et al. | 428/308.4 |
| 5,869,172 A | * | 2/1999 | Caldwell | 428/306.6 |
| 6,492,012 B1 | * | 12/2002 | Shah | 428/304.4 |
| 2007/0027259 A1 | * | 2/2007 | Yoshida | 525/199 |

FOREIGN PATENT DOCUMENTS

| | | |
|---|---|---|
| CN | 1413818 A | 4/2003 |
| EP | 1 084 821 A2 | 3/2001 |
| EP | 2 098 350 A1 | 9/2009 |
| JP | 47-34379 | 12/1972 |
| JP | 4361012 | 12/1992 |
| JP | 6-278153 | 10/1994 |
| JP | 7-229097 | 8/1995 |
| JP | 9277295 | 10/1997 |
| JP | 2002-285463 A | 10/2002 |
| JP | 2004-167727 | 6/2004 |
| JP | 2005-2148 | 1/2005 |
| WO | WO 93/18913 | 9/1993 |

OTHER PUBLICATIONS

Macrogalleria (Jan. 19, 2005; [online] [retrieved on Feb. 27, 2009]; Retrieved from: the Wayback Machine (www.archive.org); http://www.pslc.ws/mactest/index.htm).*
Grabestos flyer, 2008.*
Grabestos-2 flyer, 2007.*
Liu, "Development and Application of the Cushioning Material from Natural Fibres," Packaging Engineering vol. 14, No. 1, pp. 7-10, 1993, English Abstract on p. 10.
European Search Report for European Application No. 07745075.7 dated Apr. 12, 2012, pp. 1-8.

* cited by examiner

*Primary Examiner* — Irina Krylova
(74) *Attorney, Agent, or Firm* — Ditthavong Mori & Steiner, P.C.

(57) ABSTRACT

A hot-press cushion material is a complex comprising paper formed of a fiber material and a rubber impregnated in the paper, and the volume ratio between the fiber material and the rubber is within a range of 1/1.5 to 1/7.5, and the void ratio in the complex is within a range of 60 to 90%.

13 Claims, 1 Drawing Sheet

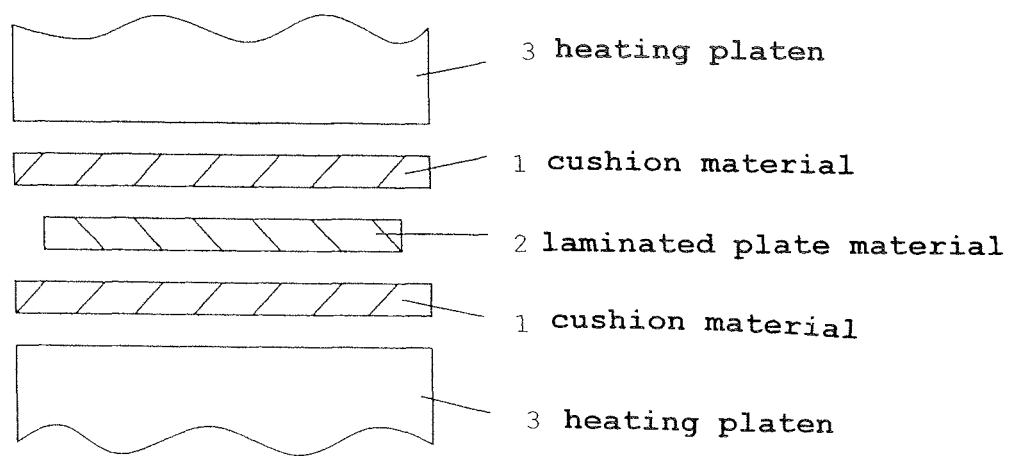
PRIOR ART

HOT-PRESS CUSHION MATERIAL AND MANUFACTURING METHOD OF THE SAME

BACKGROUND OF THE INVENTION

1. Field of the Invention

The present invention relates to a hot-press cushion material and its manufacturing method. More particularly, the present invention relates to a cushion material used when an object is press formed or hot pressed in a manufacturing process for a precision apparatus component (referred to as "laminated plate" in the present invention) such as a copper clad laminated plate, a flexible printed substrate, a multilayered printed substrate, an IC card, a liquid crystal display plate, and a ceramics laminated plate, and a manufacturing method of the above cushion material.

2. Description of the Background Art

When the laminated plate such as the printed substrate is manufactured, at the step of press forming or hot pressing, a laminated plate material 2 to be pressed is sandwiched between heating platens 3 and 3 as heating and pressing means and certain pressure and heat are applied to it as shown in FIG. 1. In order to provide a high precision formed product, it is necessary to apply heat and pressure to the laminated plate material 2 uniformly over the whole surface in the hot pressing. In this respect, the hot pressing is performed with a flat cushion material 1 interposed between the heating platen 3 and the laminated plate material 2.

Here, the general characteristics required for the cushion material 1 include cushion characteristics for absorbing the irregularities of the heating platen 3 and the laminated plate material 2, in-plane uniformity for transmitting the heat and the pressure from the heating platen 3 to the laminated plate material 2 uniformly over the whole pressing surface, heat conductivity for transmitting the heat from the heating platen 3 to the laminated plate material 2 effectively, heat resistance resisting against the pressing temperature and the like.

Conventionally, the hot-press cushion material 1 has been formed by laminating 3 to 20 pieces of kraft paper or linter paper in many cases. The paper cushion material is inexpensive and has balanced material properties in view of the cushion characteristics, in-plane uniformity and heat conductivity. This is considered that the fact that paper contains an appropriate void contributes to the cushion characteristics, the fact that the fibers constituting the paper are oriented in almost plane direction contributes to the in-plane uniformity, and the fact that the thickness of one piece is as small as 0.1 to 1 mm contributes to the heat conductivity. However, the paper cushion material has disadvantages such that the void cannot be restored after the pressing and the constituent fiber deteriorates by heat, so that it cannot be used a plurality of times repeatedly.

Meanwhile, as the hot-press cushion material that can be used repeatedly, there are various kinds of materials such as organic or inorganic fibers bound by a binder, a rubber, a unwoven fabric, a laminated body of rubber and unwoven fabric.

Japanese Unexamined Patent Publication No. 4-361012 (patent document 1) discloses a hot-press cushion material in which webs and fabrics are laminated alternately and needling-joined and a needlepunched unwoven is impregnated with a heat-resistant resin and heated and pressed so that its density may be within a range of 0.6 g/cm$^3$ to 0.9 g/cm$^3$. Here, the unwoven is formed of a meta-aromatic polyamide fiber, hemp (ramie), and polyester, and as the heat-resistant resin, a silicone rubber, an ethylene acrylic rubber and an EPDM are used. According to the patent document 1, it is said that even after the cushion material is used repeatedly for the pressing a plurality of times, its cushion characteristics can provide temporal stability by defining the density within the above specific range.

However, according to the needlepunched unwoven used in the Japanese Unexamined Patent Publication No. 4-361012 (patent document 1), unlike the paper manufactured through wet processing, since the fibers are mechanically joined by needling the webs through dry processing, the density of the web itself is not uniform. Therefore, the hot-press cushion material comprising the needlepunched unwoven has disadvantages such that the in-plane uniformity for transmitting the temperature and the pressure uniformly is inferior to that of the paper cushion material. Furthermore, the needlepunched unwoven has disadvantages such that it becomes thick inevitably because it is needled in a thickness direction, that is, in the case of the hot-press cushion material disclosed in the Japanese Unexamined Patent Publication No. 4-361012 (patent document 1), for example, its thickness is as long as 3.3 mm to 3.7 mm finally, so that the heat conductivity is not good. Furthermore, according to the hot-press cushion material disclosed in the Japanese Unexamined Patent Publication No. 4-361012 (patent document 1), since the needlepunched unwoven is impregnated with the heat-resistant resin and then heated and pressed, its void ratio becomes small, so that the cushion characteristics is not improved so much. That is, according to the hot-press cushion material disclosed in the Japanese Unexamined Patent Publication No. 4-361012 (patent document 1), in order to temporally stabilize the material properties after used repeatedly, the in-plane uniformity, the heat conductivity and the cushion characteristics are sacrificed.

In addition, Japanese Unexamined Patent Publication No. 9-277295 (patent document 2) discloses a hot-press cushion material in which a heat-resistant fiber base material having a thickness of 0.1 to 10 mm is impregnated with a fluoro rubber, silicone rubber or butyl rubber and the heat conductivity in the thickness direction is set to 4.0×10$^{-4}$ cal/cm/sec/° C. or more. Here, the heat-resistant fiber base material includes a stainless needle felt, mat-shaped unwoven of carbon fiber, unwoven of glass fiber and the like.

The object of the invention according to the Japanese Unexamined Patent Publication No. 9-277295 (patent document 2) is to improve the heat conductivity. However, the hot-press cushion material disclosed in the Japanese Unexamined Patent Publication No. 9-277295 (patent document 2) has disadvantages that since it is impregnated with a lot of rubber, that is, 3 to 10 kg per square meter of the fiber base material having a thickness of 0.1 to 10 mm, the void of the fiber base material is filled with the rubber almost completely, so that its cushion characteristics deteriorates considerably. That is, according to the Japanese Unexamined Patent Publication No. 9-277295 (patent document 2), in order to improve the heat conductivity, the cushion characteristics is sacrificed.

SUMMARY OF THE INVENTION

It is an object of the present invention to provide a hot-press cushion material that can be used a plurality of times repeatedly for hot pressing and is superior in cushion characteristics, in-plane uniformity and heat conductivity, and its manufacturing method.

A hot-press cushion material according to the present invention is a complex comprising paper formed of a fiber material and a rubber impregnated in the paper, and the volume ratio between the fiber material and the rubber is within a range of 1/1.5 to 1/7.5 and the void ratio in the complex is within a range of 60 to 90%.

Since the hot-press cushion material according to the present invention is the complex comprising the paper formed of the fiber material and the rubber impregnated in the paper, the surface of the fiber constituting the paper is covered with the rubber and the void in the fiber is appropriately filled with the rubber, so that it has strength as a fiber reinforcing rubber (FRR). In addition, the cushion material has the preferable cushion characteristics at the time of pressing because of the void. Meanwhile, since the cushion material has the complex structure with the fiber and the rubber, the fiber is prevented from being fractured and the void can be restored after the pressing because of the rubber. Thus, the cushion material can be used a plurality of times repeatedly for the hot press. In addition, since the base material comprises paper, the fiber is oriented in a surface direction and the thickness per one piece of paper can be small. Thus, the same in-plane uniformity and heat conductivity as those of the paper cushion material such as the kraft paper used conventionally can be provided.

Furthermore, since the volume ratio between the fiber material and the rubber is within the range of 1/1.5 to 1/7.5 and the void ratio in the complex is within the range of 60 to 90%, the hot-press cushion material is superior in cushion characteristics and since the cushion characteristics can be maintained even after used a plurality of times for the hot press repeatedly, it is also superior in durability.

Here, when the volume ratio of the rubber to the volume 1 of the fiber material is smaller than 1.5, the restoring force of the void is lowered and the fiber is likely to be damaged, so that when it is used repeatedly, the cushion characteristics is rapidly lowered. Meanwhile, when the volume ratio of the rubber to the volume 1 of the fiber material is larger than 7.5, since the void ratio is too low, the cushion characteristics of the cushion material itself is lowered.

When the void ratio as a whole is lower than 60%, the cushion characteristics of the cushion material itself is also lowered because the void ratio is too small. Meanwhile, when the void ratio as a whole is higher than 90%, since the strength as the fiber reinforcing rubber (FRR) is lowered, the durability after used a plurality of times for the hot press repeatedly is lowered.

More preferably, the volume ratio between the fiber material and the rubber is within a range of 1/2.5 to 1/6 and the void ratio in the complex is within a range of 65 to 80%.

It is preferable that the fiber material constituting the paper is glass, rock wool, carbon, ceramics, metal, polybenzazol, polyimide, aromatic polyamide, and polyamide. As the fiber material, only one kind may be used from the above materials or two or more kinds may be used. Since these fiber materials are superior in heat resistance and strength, even when they are used as the hot-press cushion material repeatedly, durability is maintained. Among of them, the glass, carbon, ceramics and metal that are inorganic fibers are preferable because they are more superior in dimension stability against heat and compressive force. Especially, the glass fiber is most preferable because it is superior in heat resistance and strength and it is easily formed into paper in which fibers are uniformly diffused by a wet papermaking method and low in cost.

As the rubber with which the paper is impregnated, a fluoro rubber, an EPM, an EPDM, a nitrile hydride rubber, a silicone rubber, an acrylic rubber, and a butyl rubber are preferable. Only one kind may be used from the above or two or more kinds may be mixed. These rubbers are all superior in heat resistance. Among them, the fluoro rubber is most preferable because it is especially superior in material properties of heat resistance and strength.

It is preferable that the thickness of the paper is within a range of 0.1 to 1.0 mm. When the paper having the thickness 1.0 mm or less is used, since one sheet of cushion material can be thin, excellent heat conductivity and in-plane uniformity can be provided as the cushion material. On the contrary, when the paper thickness exceeds 1.0 mm, its heat conductivity and in-plane uniformity are lowered. Meanwhile, when the paper thickness is less than 0.1 mm, it becomes difficult to ensure the predetermined void ratio when it is impregnated with the rubber, so that preferable cushion characteristics cannot be provided. In order to sufficiently permeate the rubber in the paper sufficiently and to ensure the predetermined void ratio after the paper has been impregnated with the rubber, it is preferable that the paper having sufficient void ratio in itself is used. In this respect, it is preferable that the paper having a void ratio of 85 to 99%, more preferably 86 to 98% is used.

A manufacturing method of a hot-press cushion material according to the present invention is for manufacturing a hot-press cushion material comprising a complex of paper formed of a fiber material and a rubber impregnated in the paper and it comprises a step of permeating the paper with an unvulcanized rubber solution, a step of drying the unvulcanized rubber solution in the paper, and a step of vulcanizing a dried unvulcanized rubber, whereby there provided the complex of the paper and the rubber in which the volume ratio between the fiber material and the rubber is within a range of 1/1.5 to 1/7.5 and the void ratio in the complex is within a range of 60 to 90%. In this case, it is preferable that the vulcanizing step is performed under a non-compressed condition. When the vulcanizing process is performed under the non-compressed condition, since the hot-press cushion material can ensure the void satisfactorily, the hot-press cushion material is superior in cushion characteristics.

BRIEF DESCRIPTION OF THE DRAWINGS

FIG. 1 is an explanatory diagram for a manufacturing method of a laminated plate.

DESCRIPTION OF THE PREFERRED EMBODIMENTS

One embodiment of the present invention will be described hereinafter.

Glass paper having a thickness of 0.1 to 1.0 mm and formed of a fiber material is prepared. The glass paper is provided by forming a sheet using a glass fiber having a diameter of 3 μm to 15 μm and a length of 5 mm to 30 mm and formed by a wet papaermaking method. Such glass paper is available in the market as "Grabestos" (produced by Oribest Co., Ltd), "Cumulus" (produced by Japan Vilene Co., Ltd) and the like.

Then, the glass paper is permeated with unvulcanized fluoro rubber solution. The unvulcanized fluoro rubber solution can be adjusted by dissolving an unvulcanized fluoro rubber into a solvent such as ethyl acetate, n-butyl acetate and methyl ethyl ketone so that its solid content concentration may become 10% to 50%. The glass paper is permeated with the unvulcanized fluoro rubber solution sufficiently by coating the unvulcanized fluoro rubber solution on the glass paper or by immersing glass paper in the unvulcanized fluoro rubber solution. According to need, the glass paper permeated with the unvulcanized fluoro rubber solution is rolled by a roll to adjust an impregnated amount of the unvulcanized fluoro rubber solution.

Then, the glass paper permeated with the unvulcanized fluoro rubber solution is dried to remove the solvent of the fluoro rubber.

Then, the glass paper permeated with the unvulcanized fluoro rubber is heated at 160° C. to 250° C. for 15 minutes to 10 hours to vulcanize the fluoro rubber, whereby a hot-press cushion material is provided. The fluoro rubber is preferably vulcanized in a non-compressed condition to ensure a sufficient void in the hot-press cushion material.

In addition, the volume ratio between the fiber material and the rubber in the paper-rubber complex can be 1/1.5 to 1/7.5 and the void ratio can be 60% to 90% by appropriately selecting and adjusting the material quality and grade of the paper, the material quality of the rubber, the solid content concentration of the rubber solution, the roll amount before dried and the like. When the hot-press cushion material according to the present invention is used for the hot pressing of a laminated plate, only one sheet of the cushion material may be used or two to five laminated sheets of the cushion materials may be used. In another case, the hot-press cushion material may comprise the layer of the cushion material according to the present invention and another material layer such as a rubber or a surface detachment type film in a laminated structure.

Example 1

Samples 1 to 22 were provided under various different conditions.

As the paper formed of the fiber material, the glass paper "grabestos" (produced by Oribest Co., Ltd) that was formed into a sheet with E glass fibers (its fiber diameter is 9 μm and fiber length is 13 mm) by the wetapapermaking method was used. Two kinds of glass paper, the one having a basis weight of 53 g/m² and thickness of 0.46 mm (samples 1 to 9) and the one having a basis weight of 80 g/m² and thickness of 0.64 mm (samples 10 to 22) were used.

Meanwhile, the unvulcanized fluoro rubber solution having a solid content ratio of 30.8% formed by dissolving an unvulcanized rubber in a solvent of butyl acetate was prepared.

Thus, each glass paper was immersed in the unvulcanized fluoro rubber solution and rolled by two rolls. Thus, the glass paper was permeated with the unvulcanized fluoro rubber solution so that the solid content amount of the unvulcanized fluoro rubber might have a volume ratio shown in Table 1. Then, the glass paper permeated with the unvulcanized fluoro rubber solution was sufficiently dried to remove the solvent. Then, the glass paper containing the unvulcanized fluoro rubber was heated in an oven under a non-compressed condition at 230° C. for five hours to vulcanize the unvulcanized fluoro rubber. The rubber/fiber volume ratio and the void ratio of each sample are as shown in Table 1.

TABLE 1

|  | GLASS PAPER | | | FLUORO RUBBER | | WHOLE RUBBER/ FIBER VOLUME RATIO | VOID RATIO (%) | DENSITY (g/cm 3) |
| --- | --- | --- | --- | --- | --- | --- | --- | --- |
|  | WEIGHT (g/m²) | THICKNESS (mm) | VOLUME RATIO (%) | WEIGHT (g/m³) | VOLUME RATIO (%) | | | |
| SAMPLE 1 | 53 | 0.46 | 4.47 | 0 | 0.00 | 0.00 | 95.53 | 0.12 |
| SAMPLE 2 | 53 | 0.46 | 4.47 | 50 | 5.28 | 1.18 | 90.26 | 0.22 |
| SAMPLE 3 | 53 | 0.46 | 4.47 | 100 | 10.55 | 2.36 | 84.98 | 0.33 |
| SAMPLE 4 | 53 | 0.46 | 4.47 | 150 | 15.83 | 3.54 | 79.70 | 0.44 |
| SAMPLE 5 | 53 | 0.46 | 4.47 | 200 | 21.11 | 4.73 | 74.43 | 0.55 |
| SAMPLE 6 | 53 | 0.46 | 4.47 | 250 | 26.38 | 5.91 | 69.15 | 0.66 |
| SAMPLE 7 | 53 | 0.46 | 4.47 | 300 | 31.66 | 7.09 | 63.88 | 0.77 |
| SAMPLE 8 | 53 | 0.46 | 4.47 | 350 | 36.94 | 8.27 | 58.60 | 0.88 |
| SAMPLE 9 | 53 | 0.46 | 4.47 | 400 | 42.21 | 9.45 | 53.32 | 0.98 |
| SAMPLE 10 | 80 | 0.64 | 4.84 | 0 | 0.00 | 0.00 | 95.16 | 0.13 |
| SAMPLE 11 | 80 | 0.64 | 4.84 | 50 | 3.79 | 0.78 | 91.36 | 0.20 |
| SAMPLE 12 | 80 | 0.64 | 4.84 | 100 | 7.58 | 1.57 | 87.57 | 0.28 |
| SAMPLE 13 | 80 | 0.64 | 4.84 | 150 | 11.38 | 2.35 | 83.78 | 0.36 |
| SAMPLE 14 | 80 | 0.64 | 4.84 | 200 | 15.17 | 3.13 | 79.99 | 0.44 |
| SAMPLE 15 | 80 | 0.64 | 4.84 | 250 | 18.96 | 3.91 | 76.19 | 0.52 |
| SAMPLE 16 | 80 | 0.64 | 4.84 | 300 | 22.75 | 4.70 | 72.40 | 0.59 |
| SAMPLE 17 | 80 | 0.64 | 4.84 | 350 | 26.55 | 5.48 | 68.61 | 0.67 |
| SAMPLE 18 | 80 | 0.64 | 4.84 | 400 | 30.34 | 6.26 | 64.82 | 0.75 |
| SAMPLE 19 | 80 | 0.64 | 4.84 | 450 | 34.13 | 7.04 | 61.02 | 0.83 |
| SAMPLE 20 | 80 | 0.64 | 4.84 | 470 | 35.60 | 7.35 | 59.56 | 0.86 |
| SAMPLE 21 | 80 | 0.64 | 4.84 | 500 | 37.92 | 7.83 | 57.23 | 0.91 |
| SAMPLE 22 | 80 | 0.64 | 4.84 | 550 | 41.72 | 8.61 | 53.44 | 0.98 |
| KRAFT PAPER |  |  |  |  |  |  | 12.40 | 0.61 |

TABLE 1-continued

|  | INITIAL PROPERTIES | | | AFTER ONE PRESS | AFTER TEN PRESSES |
| --- | --- | --- | --- | --- | --- |
|  | THICKNESS (mm) | CUSHION CHARACTERISTICS (um) | HARDNESS (Asker-C) | CUSHION CHARACTERISTICS (um) | CUSHION CHARACTERISTICS (um) |
| SAMPLE 1 | 0.46 | 355 | 83 | 84 | 17 |
| SAMPLE 2 | 0.46 | 325 | 75 | 117 | 98 |
| SAMPLE 3 | 0.46 | 351 | 78 | 150 | 110 |
| SAMPLE 4 | 0.46 | 387 | 81 | 347 | 202 |
| SAMPLE 5 | 0.46 | 327 | 83 | 296 | 242 |
| SAMPLE 6 | 0.46 | 289 | 85 | 286 | 251 |
| SAMPLE 7 | 0.46 | 195 | 87 | 187 | 164 |
| SAMPLE 8 | 0.46 | 157 | 90 | 136 | 125 |
| SAMPLE 9 | 0.46 | 103 | 92 | 95 | 88 |
| SAMPLE 10 | 0.64 | 551 | 73 | 125 | 20 |
| SAMPLE 11 | 0.64 | 518 | 74 | 147 | 105 |
| SAMPLE 12 | 0.64 | 510 | 76 | 258 | 220 |
| SAMPLE 13 | 0.64 | 503 | 77 | 369 | 333 |
| SAMPLE 14 | 0.64 | 522 | 80 | 424 | 371 |
| SAMPLE 15 | 0.64 | 430 | 82 | 411 | 383 |
| SAMPLE 16 | 0.64 | 400 | 84 | 406 | 367 |
| SAMPLE 17 | 0.64 | 396 | 85 | 389 | 356 |
| SAMPLE 18 | 0.64 | 364 | 85 | 343 | 320 |
| SAMPLE 19 | 0.64 | 329 | 86 | 328 | 282 |
| SAMPLE 20 | 0.64 | 322 | 87 | 319 | 271 |
| SAMPLE 21 | 0.64 | 260 | 89 | 252 | 231 |
| SAMPLE 22 | 0.64 | 195 | 91 | 161 | 147 |
| KRAFT PAPER | 0.31 | 96 |  | 48 | — |

Since each sample is formed of paper as a base material, its fiber is oriented in a surface direction and the thickness per sheet is small, so that it is clear in view of its structure that in-plane uniformity and heat conductivity that are in no way inferior to a paper cushion material such as the kraft paper can be provided.

The cushion characteristics were measured with respect to each sample. According to a method of measuring the cushion characteristics, the sample was put in between hot plates at a temperature of 200° C. and after preheated for two minutes, a pressure was applied to the sample from 0 MPa to 4 MPa at a pressure rising speed of 1 mm/minute. Thus, the amount of variation in thickness was measured and this was used as the indicator of the cushion characteristics.

In addition, the pressing is repeated under the same condition and the variations in cushion characteristics were measured. The initial cushion characteristics, the cushion characteristics after one press, the cushion characteristics after ten presses are shown with respect to each sample in Table 1.

The cushion characteristics of the kraft paper having a basis weight of 190 g/m$^2$ and a thickness of 0.31 mm were measured for reference and shown in Table 1 also. According to the kraft paper, the material was fractured due to carbonization of the fiber at the third press and did not function as the cushion material any more.

Among the samples 1 to 22, the samples 3 to 7 and 12 to 19 satisfy the ratio between the fiber material and the rubber is ranged within 1/1.5 to 1/7.5 and the void ratio as a whole is within a range of 60% to 90%. These samples are preferable in initial cushion characteristics and cushion characteristics after repeatedly used.

In addition, the samples 4 to 6 and 14 to 17 satisfy that the volume ratio between the fiber material and the rubber is within a range of 1/2.5 to 1/6 and the void ratio as a whole is within a range of 60% to 90% and each of them is preferable in initial cushion characteristics and its lowering degree of the cushion characteristics is low after repeatedly used, so that they have superior material properties as the hot-press cushion material especially.

Although the embodiments of the present invention have been described with reference to the drawings in the above, the present invention is not limited to the above-illustrated embodiments. Various kinds of modifications and variations may be added to the illustrated embodiments within the same or equal scope of the present invention.

The present invention can be advantageously applied to the cushion material used when an object is press formed or hot pressed in a manufacturing process for a laminated plate such as a copper clad laminated plate, a flexible printed substrate, a multilayered printed substrate, an IC card, a liquid crystal display plate, and a ceramics laminated plate, and also advantageously applied to the manufacturing method of the above cushion material.

What is claimed is:

1. A hot-press cushion material consisting of a paper sheet formed of a fiber material and a vulcanized rubber impregnated in said paper sheet, wherein
   said vulcanized rubber covers the fiber material,
   voids are present among said fiber material covered by said vulcanized rubber,
   the volume ratio between said fiber material and said vulcanized rubber is within a range of 1/2.5 to 1/6,
   the void ratio in said hot-press cushion material is within a range of 65 to 80%,
   the thickness of said paper sheet is within a range of 0.1 to 1.0 mm, and
   said fiber material is glass.

2. The hot-press cushion material according to claim 1, wherein
   said vulcanized rubber includes one or more materials selected from the group consisting of a fluoro rubber, and EPM, an EPDM, a nitrile hydride rubber, a silicone rubber, an acrylic rubber, and a butyl rubber.

3. The hot-press cushion material according to claim 1, wherein
   said vulcanized rubber is a fluoro rubber.

4. The hot-press cushion material according to claim 1, wherein the paper sheet has a void ratio of 85 to 99%.

5. The hot-press cushion material according to claim 1, wherein the paper sheet has a void ratio of 86 to 98%.

6. The hot-press cushion material according to claim 1, wherein the fiber is oriented in a surface direction of the paper sheet.

7. The hot-press cushion material according to claim 6, wherein the fiber has in plane uniformity.

8. A manufacturing method of a hot-press cushion material formed by a wet papermaking process and consisting of a paper sheet formed of a fiber material and a vulcanized rubber impregnated in said paper sheet, the method comprising:
   a step of permeating said paper sheet with an unvulcanized rubber solution,
   a step of drying said unvulcanized rubber solution permeated in said paper sheet, and
   a step of vulcanizing the dried unvulcanized rubber,
   wherein said vulcanized rubber covers the fiber material, and voids are present among said fiber materials covered by said vulcanized rubber,
   wherein the volume ratio between said fiber material and said vulcanized rubber is within a range of 1/2.5 to 1/6,
   wherein the void ratio in said hot-press cushion material is within a range of 65 to 80%,
   wherein the thickness of said paper sheet is within a range of 0.1 to 1.0 mm, and
   wherein said fiber material is glass.

9. The method according to claim 8, wherein said vulcanizing step is performed under a non-compressed condition.

10. The method according to claim 8, wherein the paper sheet has a void ratio of 85 to 99%.

11. The method according to claim 8, wherein the paper sheet has a void ratio of 86 to 98%.

12. The method according to claim 8, wherein the fiber is oriented in a surface direction of the paper sheet.

13. The method according to claim 12, wherein the fiber has in plane uniformity.

* * * * *